United States Patent
Dalebroux

(10) Patent No.: US 6,690,177 B2
(45) Date of Patent: Feb. 10, 2004

(54) FREQUENCY SELECTIVE IMPROVEMENT OF THE DIRECTIVITY OF A RETURN LOSS BRIDGE

(75) Inventor: Donald J. Dalebroux, Vernonia, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/087,261

(22) Filed: Mar. 1, 2002

(65) Prior Publication Data

US 2003/0164712 A1 Sep. 4, 2003

(51) Int. Cl.[7] .................. G01R 27/04; G01R 27/32
(52) U.S. Cl. .................. 324/648; 324/637; 324/641
(58) Field of Search ............... 324/638, 639, 324/642, 645, 646, 647, 648, 637, 641

(56) References Cited

U.S. PATENT DOCUMENTS 2,778,993 A * 1/1957 Young ..................... 324/646
3,611,123 A * 10/1971 Mouw et al. ............. 324/645
4,644,260 A * 2/1987 Warder .................... 324/637
4,962,359 A * 10/1990 Dunsmore ................ 324/638
6,049,212 A * 4/2000 Oldfield ................... 324/648

* cited by examiner

Primary Examiner—N. Le
(74) Attorney, Agent, or Firm—Francis I. Gray

(57) ABSTRACT

A frequency selective improved directivity of a return loss bridge is achieved by generating a counteractive reflected energy vector to cancel a reflected energy vector caused by imperfections, such as parasitic effects and an unbalanced balun, in the return loss bridge. The counteractive reflected energy vector of equal magnitude, but opposite in phase, to the undesired reflected energy vector may be induced into a transmission path between a test port and a coupled port. An open circuit stub in the transmission path between the test port and the coupled port may be used to provide the counteractive reflected energy vector. Alternatively a path across a coupling resistor in a return loss path coupled from the test port to the coupled port may be used to provide the counteractive reflected energy vector, with PIN diodes in the coupled path being used for tunability if desired.

9 Claims, 13 Drawing Sheets

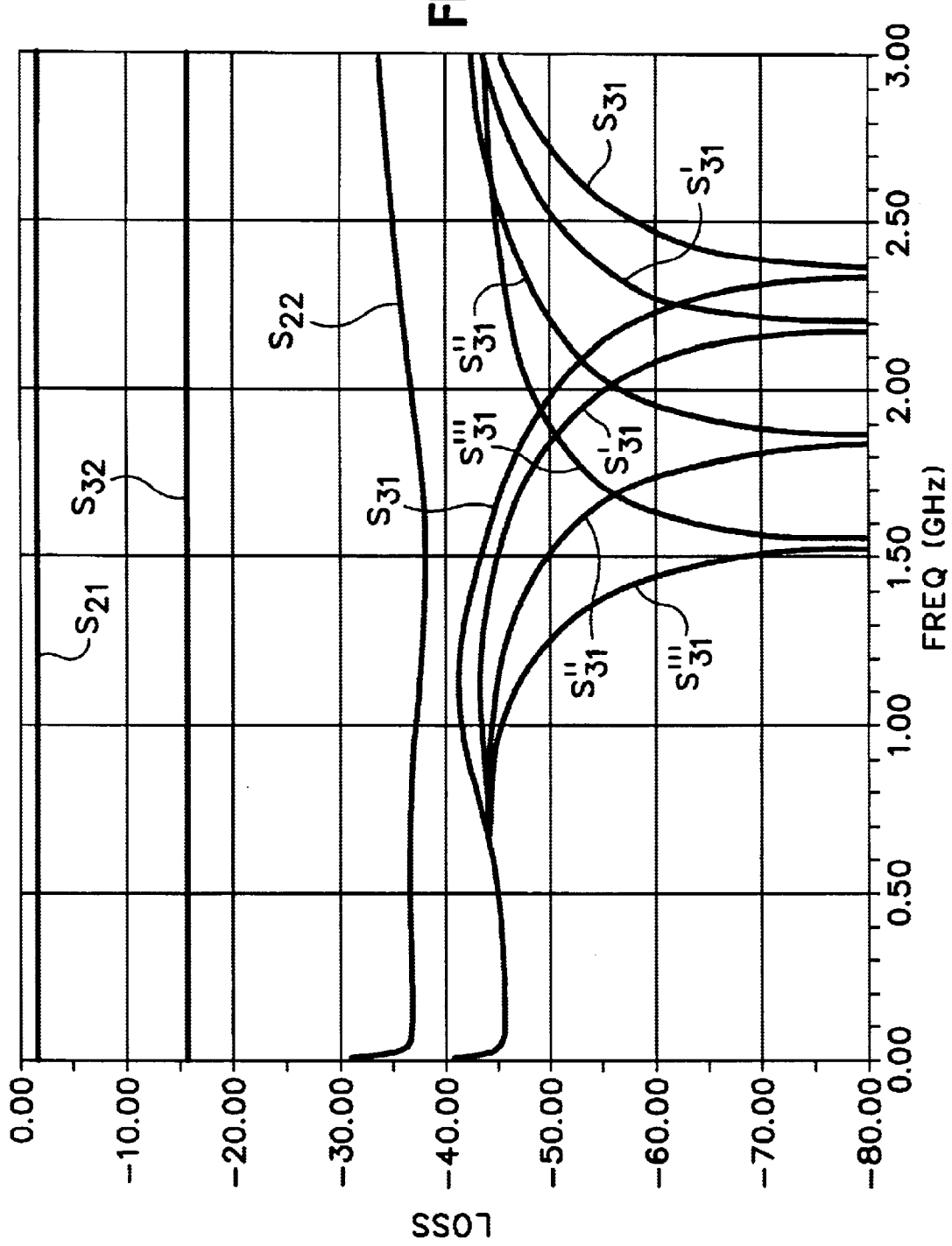

US 6,690,177 B2

FREQUENCY SELECTIVE IMPROVEMENT OF THE DIRECTIVITY OF A RETURN LOSS BRIDGE

BACKGROUND OF THE INVENTION

The present invention relates to a frequency domain instrument, and more particularly to frequency selective improvement of the directivity of a return loss bridge.

A return loss bridge is a three-port device in which a coupled port directionally couples a fixed amount of radio frequency (RF) energy from a transmission path between a transmission port and a test port, i.e., the bridge couples some energy to the coupled port from an energy wave traveling along the transmission path in a reverse direction and rejects energy from an energy wave traveling in a forward direction. Therefore the return loss bridge may be used to measure the return loss—reflected power relative to incident power—of a load terminating the energy wave in the forward direction at the test port. There is a finite difference between the coupled and rejected energy at the coupled port as there is not perfect rejection of the energy wave in the forward direction. This is a figure of merit of the bridge known as "directivity." Directivity is defined as the difference, usually in dB, in the power at the coupled port when the test port is terminated in a fully reflected load—open or shorted—and in a perfect nonreflective load of the same characteristic impedance or at least a load that is much better than the directivity of the bridge.

A schematic for an ideal bridge (without parasitic effects) is shown in FIG. 1. The coefficient k is a trade-off chosen depending upon the amount of coupling desired at the coupled port P3 versus the loss incurred in the transmission path between the transmission port P1 and the test port P2. Energy in the forward direction travels from port P1 to port P2, and energy in the reverse direction travels from port P2 to port P1 with a portion coupled to port P3 by a coupling resistor $R_0/k$. A measurement instrument receiver is connected to port P3 while a measurement instrument transmitter is connected to port P1 and a system under test is connected to port P2. A representative value of k=0.2 provides about −17 dB of coupling ($S_{22}$) and about −2 dB of loss ($S_{21}$), as shown in FIG. 2. With an ideal balun and no parasitic effects in the circuit the directivity is infinite, i.e., none of the energy wave in the forward direction is coupled to port P3. However a ferrite encased coaxial balun does not provide a perfectly balanced output and causes the directivity to be finite. This finite directivity is defined as an inherent directivity. The inherent directivity is primarily determined by the unbalance provided by the balun formed by the ferrite encased coaxial line assuming no other parasitic effects in the rest of the circuit. If the parasitic effects are kept to a minimum by compact part placement and short line lengths, in particular the length and transitions between port P2 and the coupling resistor $R_0/k$, an inherent directivity of >30 dB up to very high frequencies, such as 3 GHz, may be achieved. FIG. 3 is a schematic for a return loss bridge with minimal circuit parasitic effects and a balun modeled by an ideal transformer with shunt resistive and inductive parasitics to simulate the unbalance of the ferrite encased coaxial cable.

FIG. 2 is a plot of the simulated results of the circuit of FIG. 3. The directivity is the difference between the loss from port P2 to port P3 ($S_{32}$) and the loss from port P1 to port P3 ($S_{31}$). As shown there is a consistent directivity of 30 dB across the frequency sweep up to 3 Ghz. This is the inherent directivity of the bridge with this ferrite encased coaxial cable and no other parasitic effects in the circuit.

However there are situations where, in order to fit the bridge into a specific package, an implementation of the bridge is built that introduces significant parasitic effects. For example where the bridge is built on a circuit board having both sides etched, having via hole transitions, and having a right angle SNA to N cable placed between port P2 and resistor $R_0/k$, all of these discontinuities conspire to degrade the measured or apparent directivity of the bridge. This occurs because the discontinuities in the characteristic impedance of the line cause reflections of the energy wave in the forward direction between port P1 and port P2 before it has a chance to dissipate in the perfect termination at port P2. These reflections couple to port P3 and sum with the energy which is at port P3 due to the inherent directivity caused by imbalance (see FIG. 11). Together the two vectors representing the undesired reflected energy due to parasitic effects and the inherent directivity due to the unbalance of the balun sum to the apparent directivity vector.

To improve the directivity where there are significant parasitic effects, the parasitic effects could be tuned out, depending upon the highest frequency for which the bridge is specified. However at high frequencies, such as 2.5 GHz, it is difficult, if not impossible, to tune two right angle transitions for a return loss on the order of >30 dB. If it were possible, the apparent directivity would return to the inherent directivity without the discontinuities. Therefore the directivity of the bridge is still limited to the inherent directivity.

What is desired is a method of improving the apparent or inherent directivity of a return loss bridge when there are imperfections introduced by the implementation architecture, especially in a frequency region of interest.

BRIEF SUMMARY OF THE INVENTION

Accordingly the present invention provides a method of frequency selective improvement of the directivity of a return loss bridge by creating a counteractive reflected energy vector at a coupled port that cancels an apparent directivity vector over a desired frequency range. The counteractive reflected energy vector is the vector sum of an inherent directivity vector due to unbalance of a balun and a reflected energy vector from undesired energy reflections caused by parasitic effects in a transmission path between a transmission port and a test port of the bridge. One embodiment inserts an open circuit stub between a coupling resistor and the test port together with a length of transmission line to induce the counteractive reflected energy vector in the transmission path. The magnitude of the counteractive reflected energy vector is determined by the size of the open circuit stub and is made equal to the magnitude of the apparent directivity vector, and the phase is 180° opposed to that of the apparent directivity vector as determined by the length of the transmission line between the coupling resistor and the open circuit stub. Alternatively to avoid degrading the return loss of the test port—another figure of merit of the bridge—caused by the first embodiment, energy may be coupled from the transmission path between the coupling resistor and the test port to the coupled port with directional couplers. The coupling coefficient of the couplers determines the magnitude of the counteractive reflected energy vector at the coupled port, which magnitude is set to be equal to that of the apparent directivity vector. The path between the couplers includes a transmission line, the length of which determines the phase of the counteractive energy vector at the coupled port to be in opposition to the phase of the apparent directivity vector. The transmission line and couplers may be enhanced with PIN diodes to provide tunability. In this case the coupling coefficient provides a counteractive vector whose magnitude is greater than the apparent directivity vector, and the PIN diodes are tuned to adjust the counteractive reflected energy vector magnitude and phase at the coupled port to provide improved directivity over the desired frequency range.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 13 is a graphic diagram view illustrating the tunability of the improved directivity provided by the embodiment of FIG. 12 according to the present invention.

DETAILED DESCRIPTION OF THE INVENTION

Figure 1:
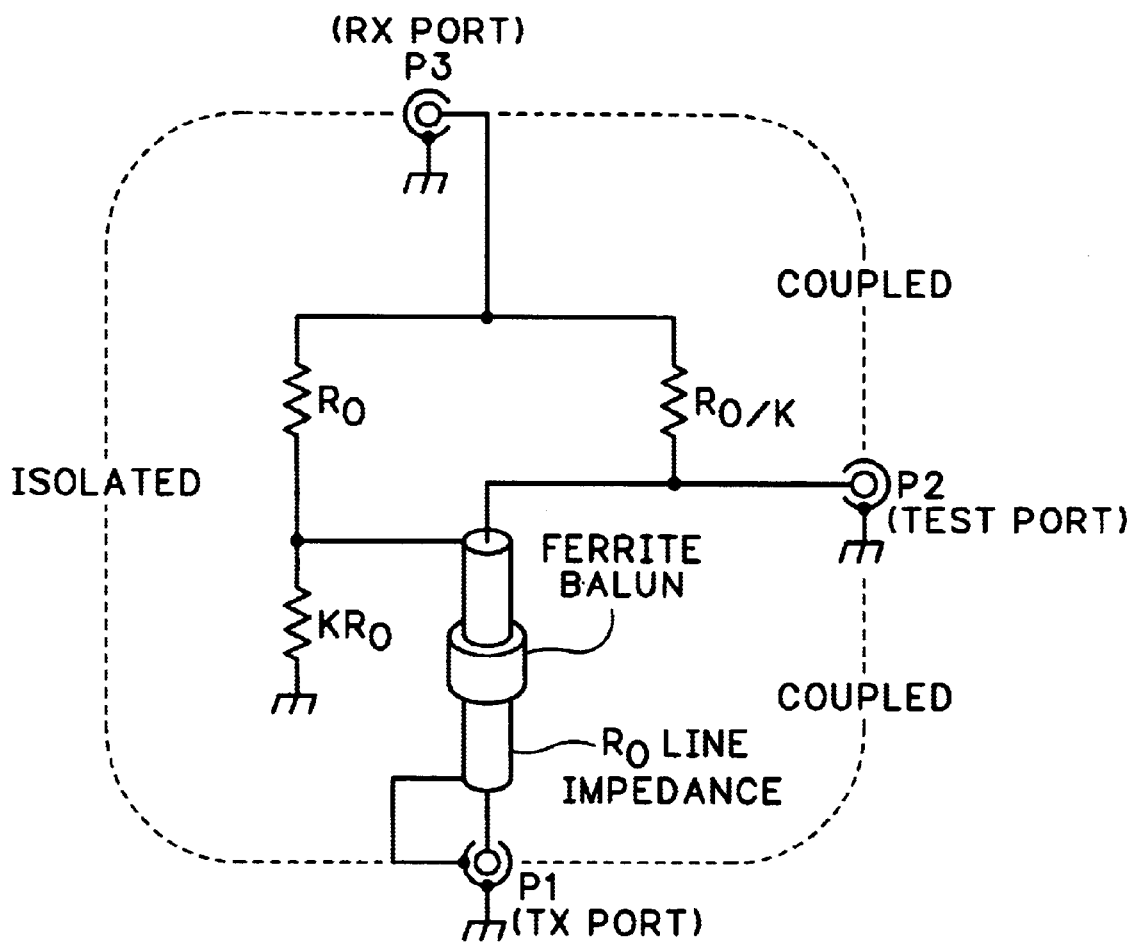
FIG. 1 is a schematic diagram view of an ideal return loss bridge.
Figure 2:
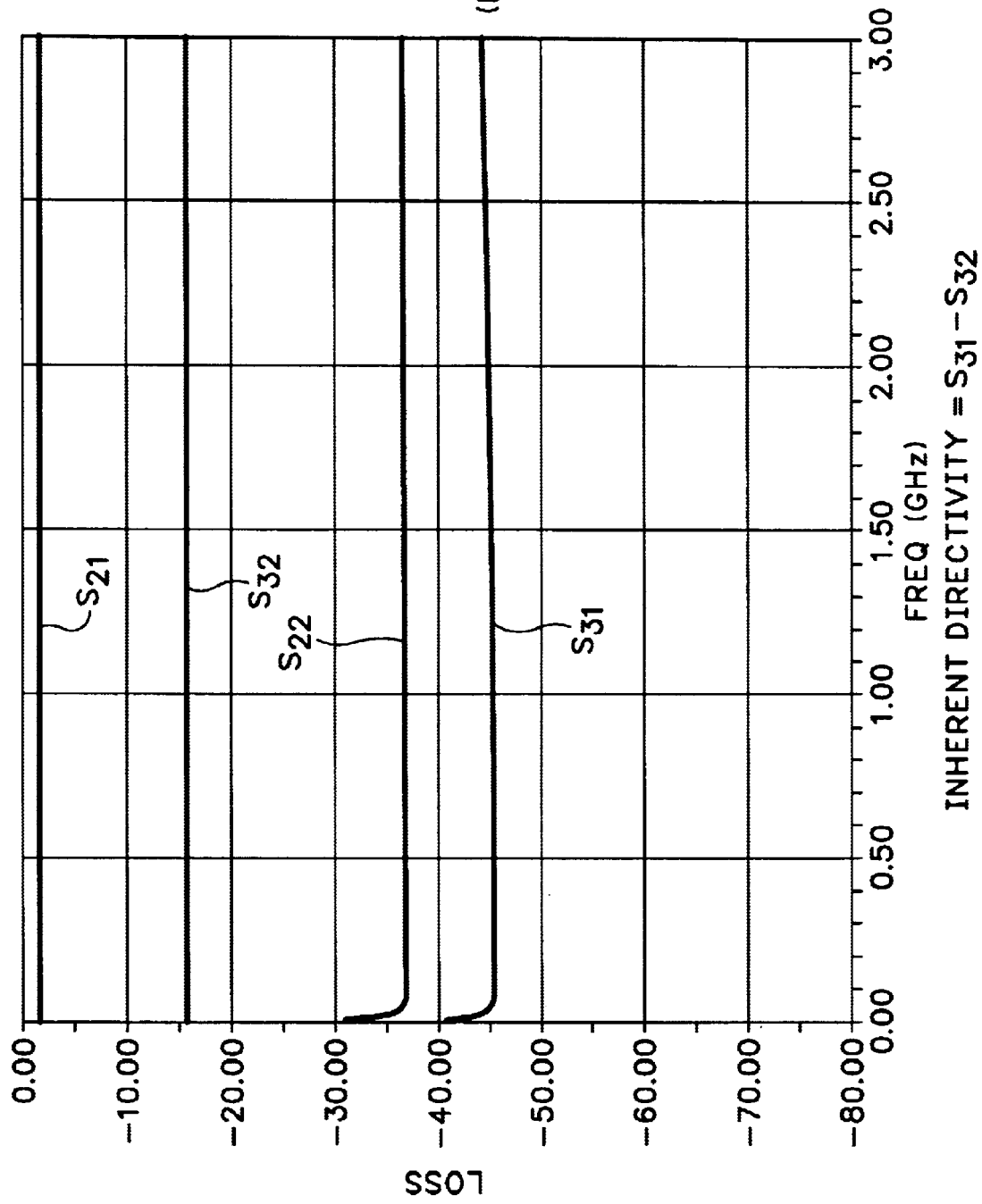
FIG. 2 is a graphic diagram view illustrating inherent directivity of a return loss bridge having minimal parasitic effects.
Figure 3:
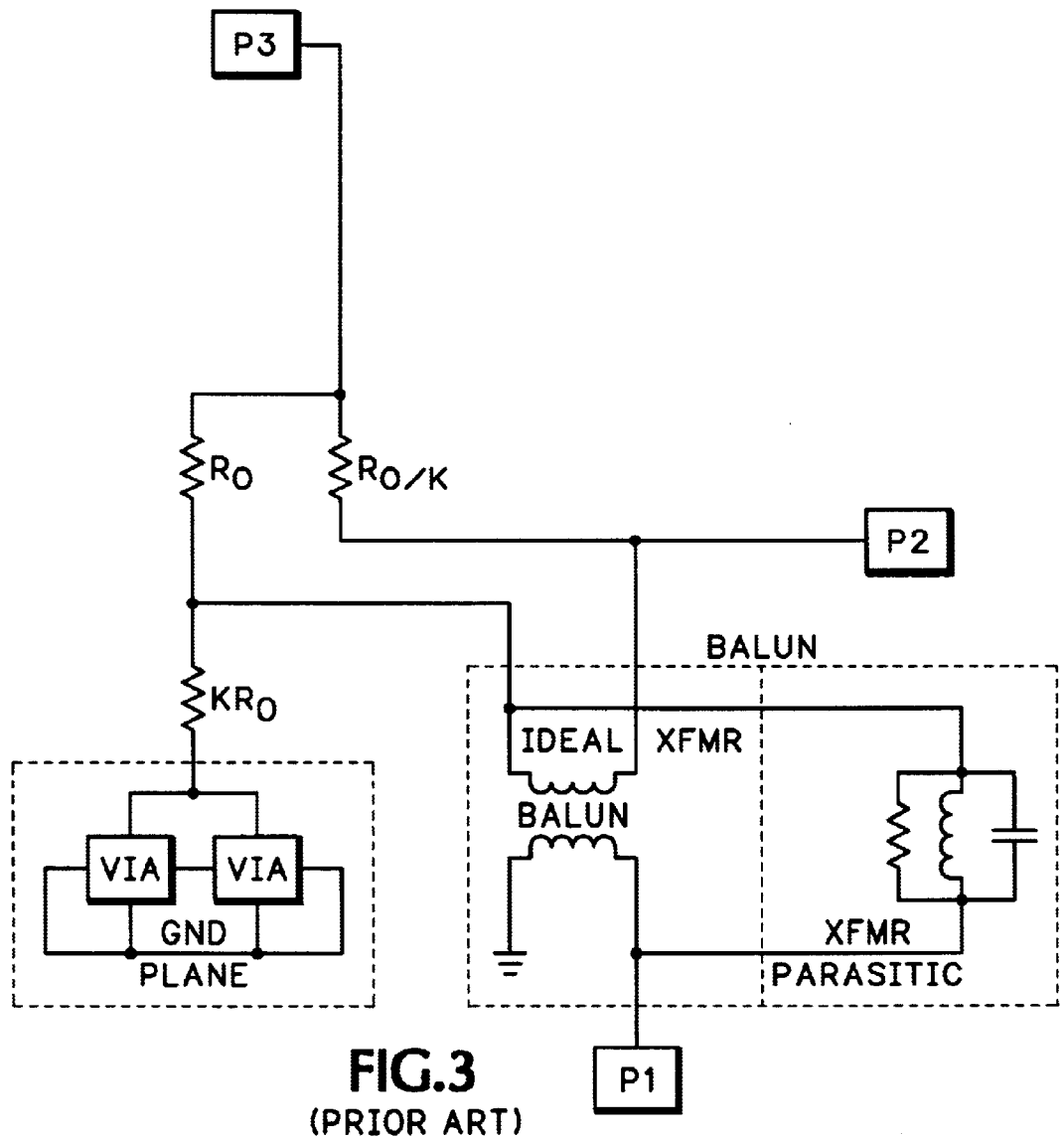
FIG. 3 is a schematic diagram view of a return loss bridge with minimal parasitic effects.
Figure 4:
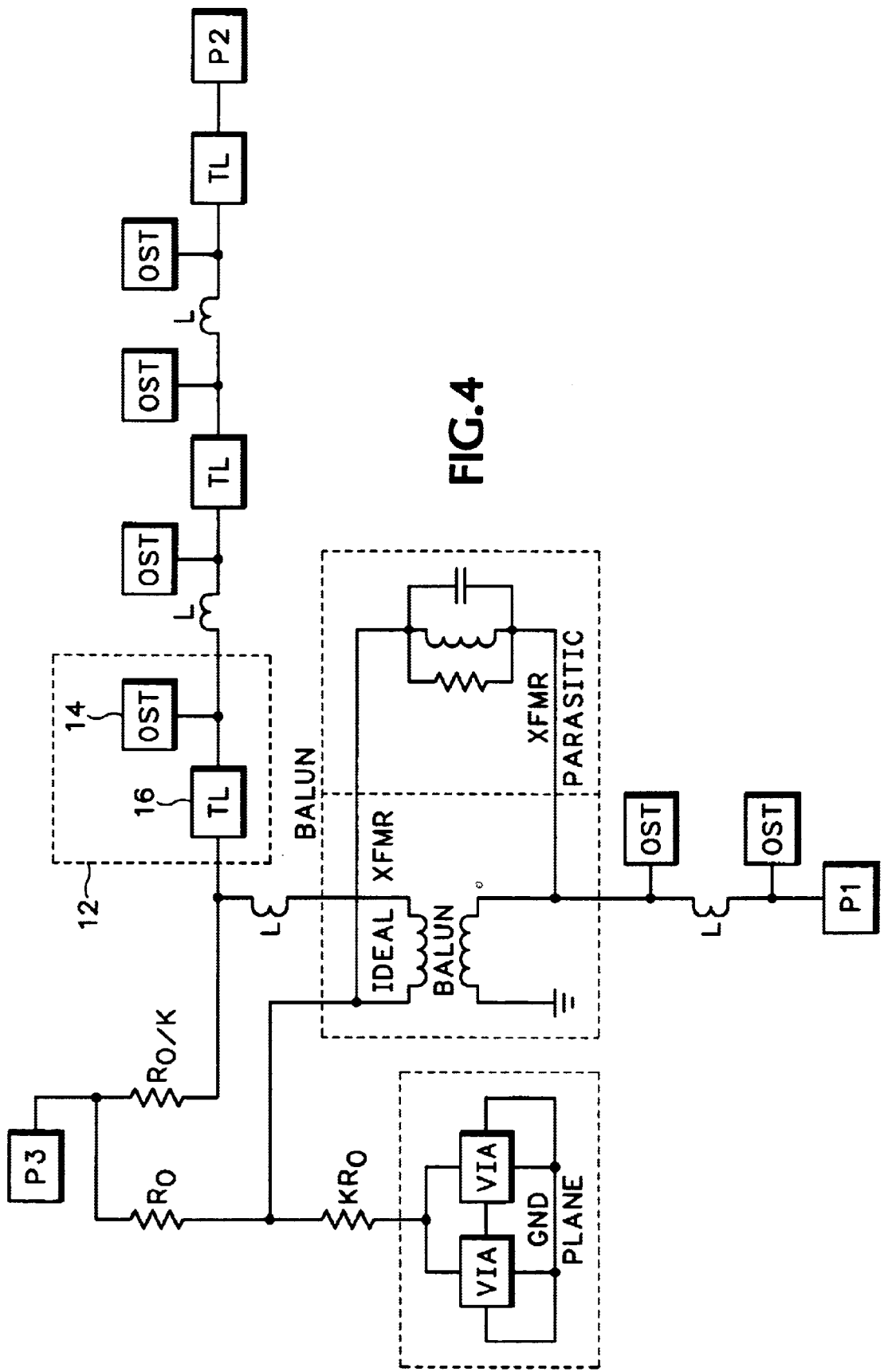
FIG. 4 is schematic diagram view of a return loss bridge with significant parasitic effects having improved directivity according to the present invention.
Figure 5:
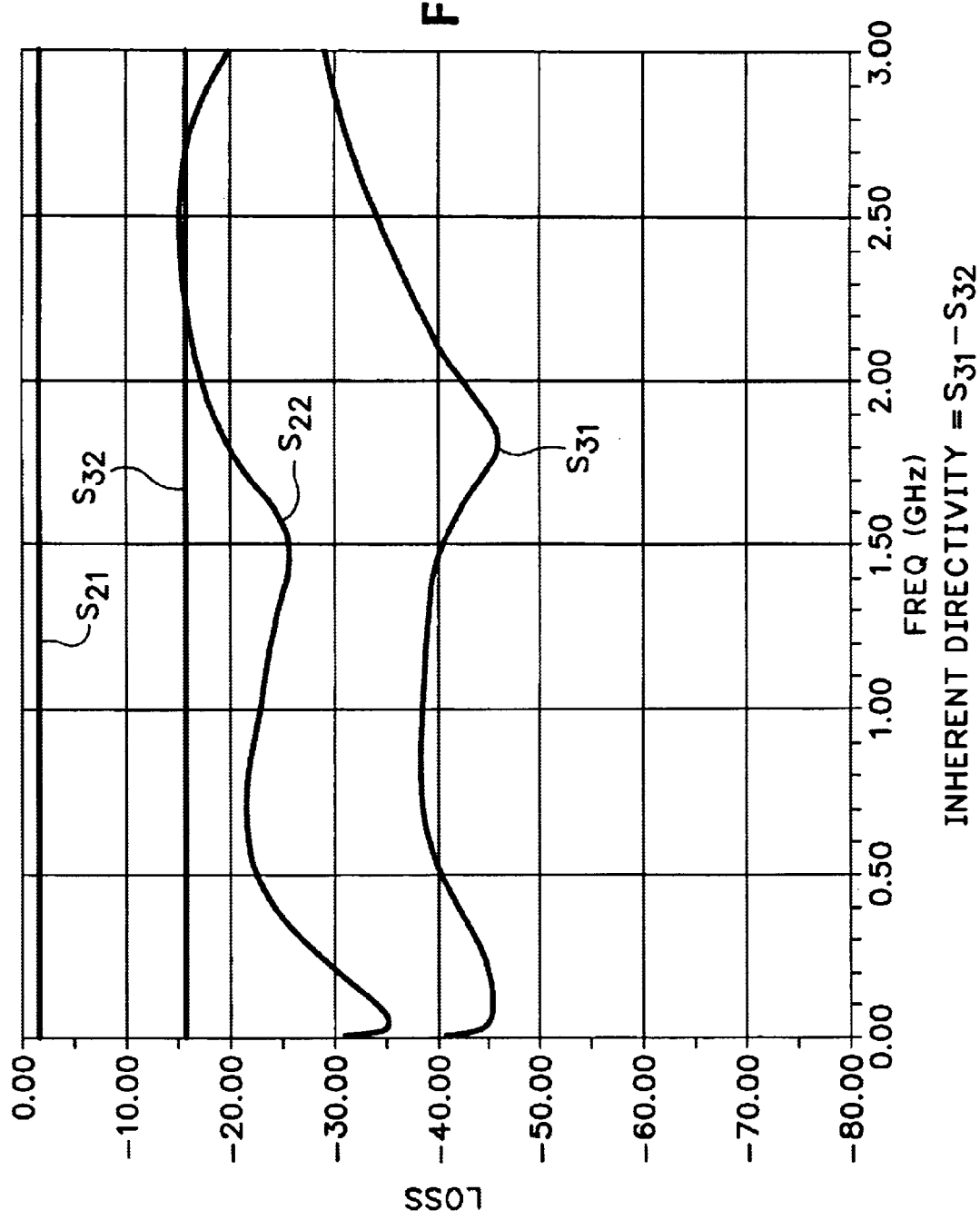
FIG. 5 is a graphic diagram view illustrating apparent directivity of the return loss bridge of FIG. 4 without improved directivity.

Referring now to FIG. 4 a return loss bridge with imperfections is shown. Between port P1 and the balun energy reflections occur in traversing between levels of a circuit board, such as front to back via hole transitions, and are represented by open circuit stubs OST and an inductor L. Likewise similar reflections occur between port P2 and the junction with a coupling resistor $R_0/k$ which introduce significant parasitic effects. In this instance a couple of such level traversals are shown with accompanying open circuit stubs OST and inductors L, such traversals being coupled by respective transmission line segments TL. FIG. 5 shows the effects of the significant parasitic effects on the inherent directivity. Port P2 return loss is degraded from the minimal parasitic effects version shown in FIG. 2, as also is the inherent directivity to produce an apparent directivity. Where the requirement for a bridge is 20 dB or greater from 25 MHz to 2.5 GHz, there is only 18 dB of apparent directivity at 2.5 Ghz in this instance.

Figure 6:
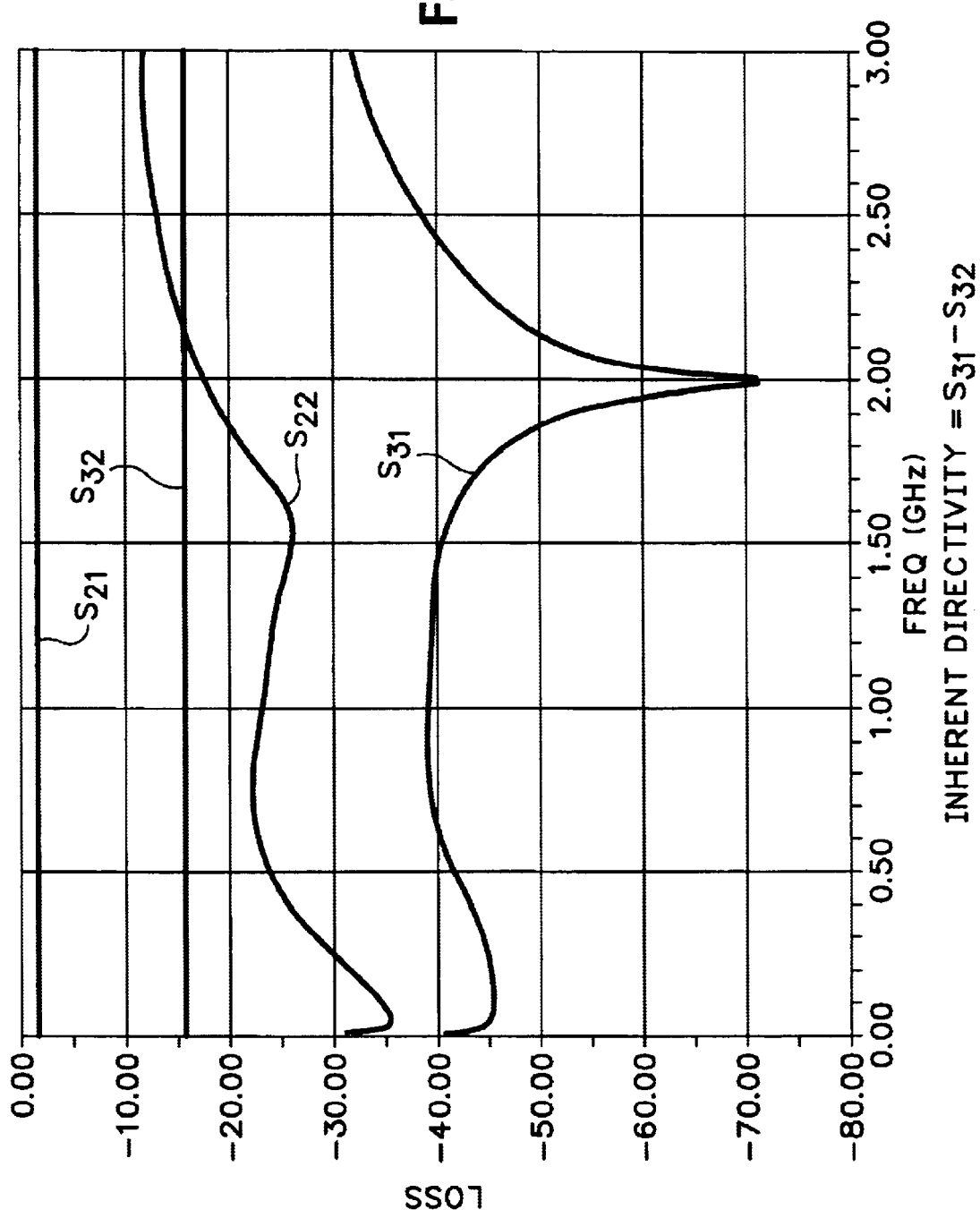
FIG. 6 is a graphic diagram view illustrating improved apparent directivity of the return loss bridge of FIG. 4 according to the present invention.

One solution is to induce an opposing parasitic effect 12 along the line between the coupling resistor $R_0/k$ and port P2 which induces a counteractive reflected energy vector that has the same magnitude but is opposite in phase to the apparent directivity vector at port P1 due to the significant parasitic effects. The magnitude and phase may be controlled by the amount and type—capacitive or inductive or both—of the induced opposing parasitic effect 12 to create a null in the apparent directivity at a desired frequency. For example as shown in FIG. 4 an open circuit stub 14 and a transmission line 16 are added to induce a counteractive reflected energy vector of the desired magnitude and phase to cancel the undesired reflected energy vector due to the imperfections. The effect of the induced opposing parasitic effect 12 in this embodiment is shown by comparing FIG. 6 with FIG. 5. There is a null in $S_{31}$, and the apparent directivity in the 2–2.5 GHz range is increased to about 23 dB at 2.5 GHz. The result is an improved apparent directivity that is greater than the inherent directivity over a narrow bandwidth, such as over the 1.75 GHz to 2.25 GHz range in this example.

Figure 7:
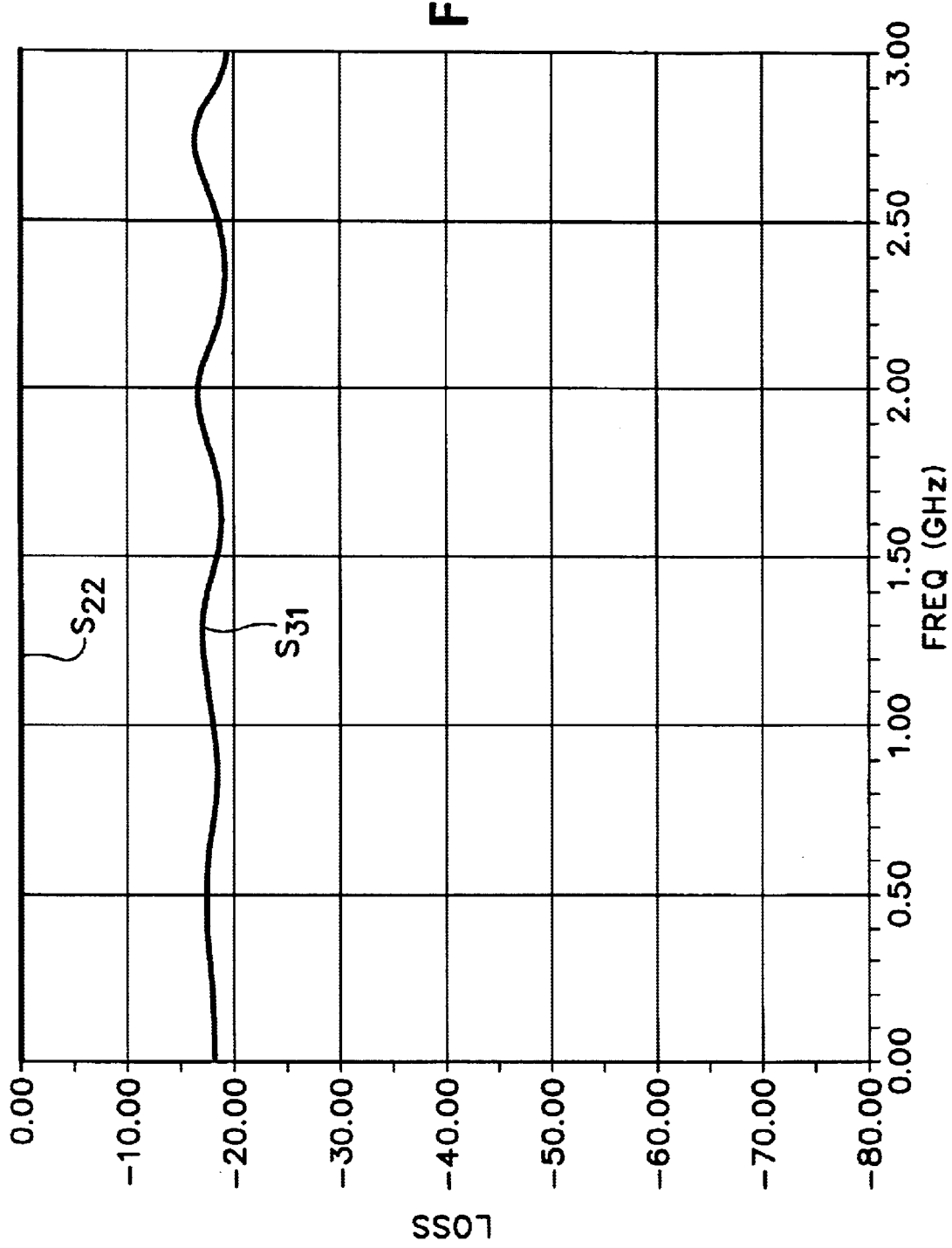
FIG. 7 is a graphic diagram view illustrating the effect on return loss looking back into the test port of the embodiment of FIG. 4.
Figure 8:
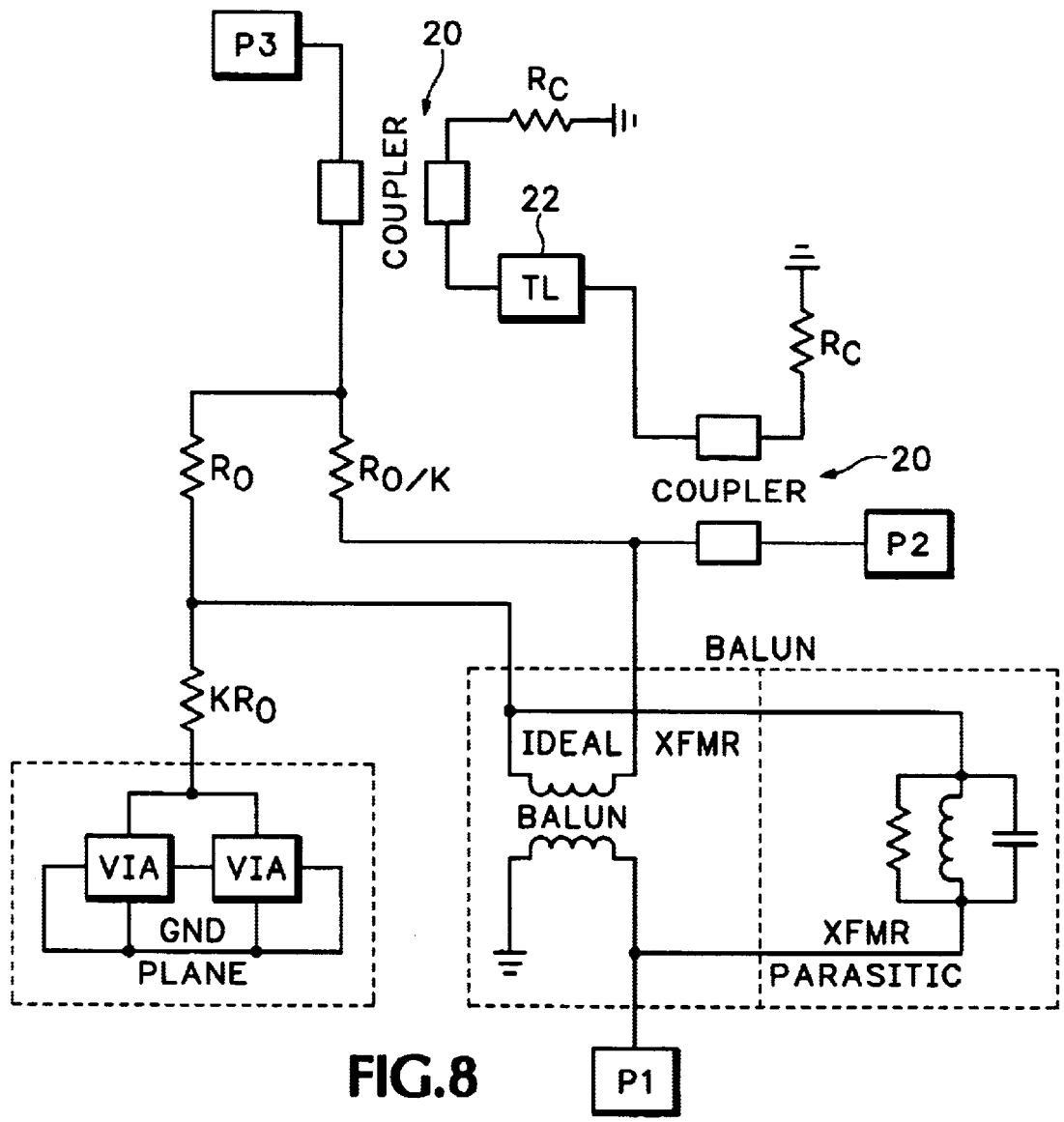
FIG. 8 is a schematic diagram view of a return loss bridge with an alternative embodiment for improved directivity according to the present invention.
Figure 9:
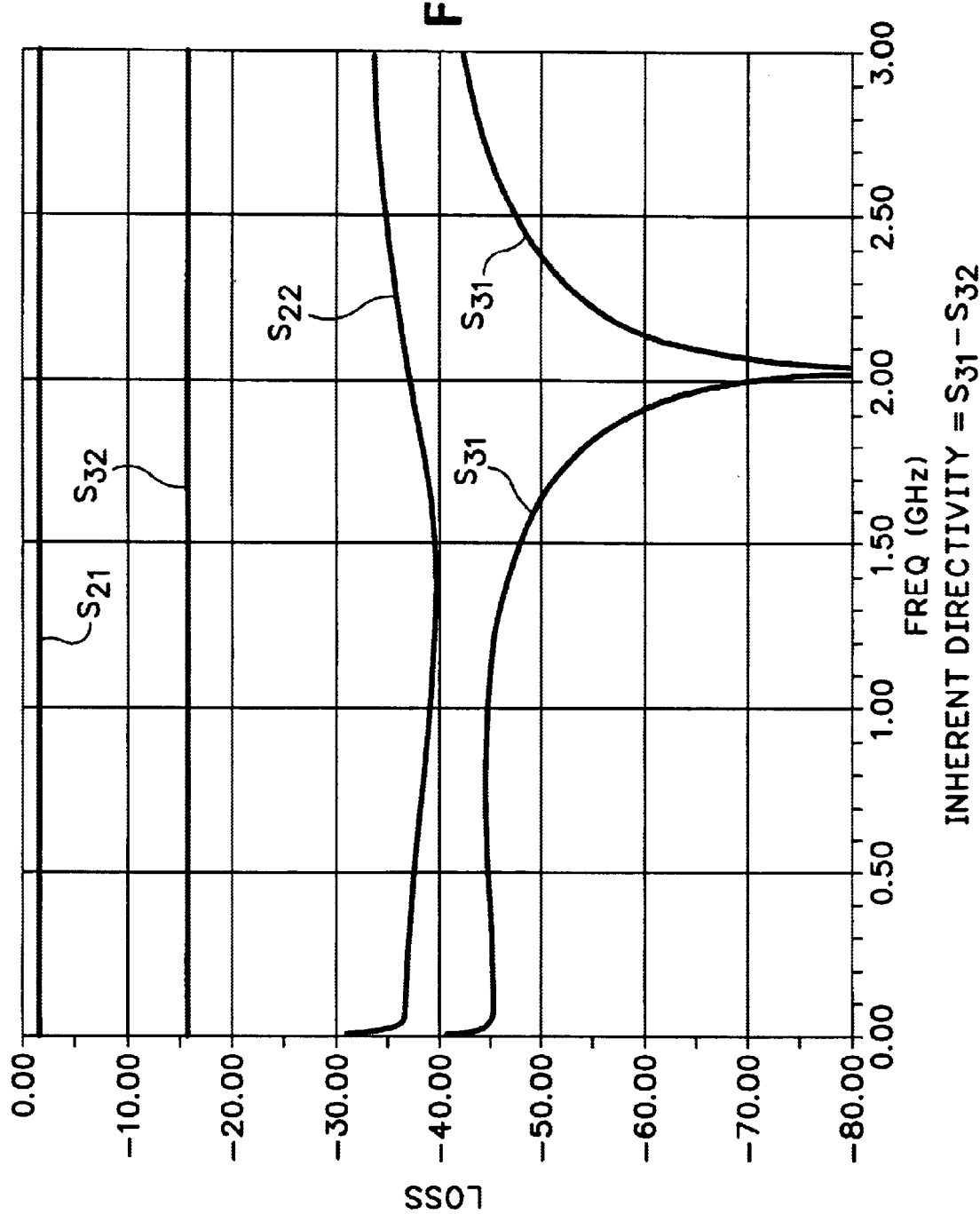
FIG. 9 is a graphic diagram view illustrating improved directivity of the return loss bridge of FIG. 8.
Figure 10:
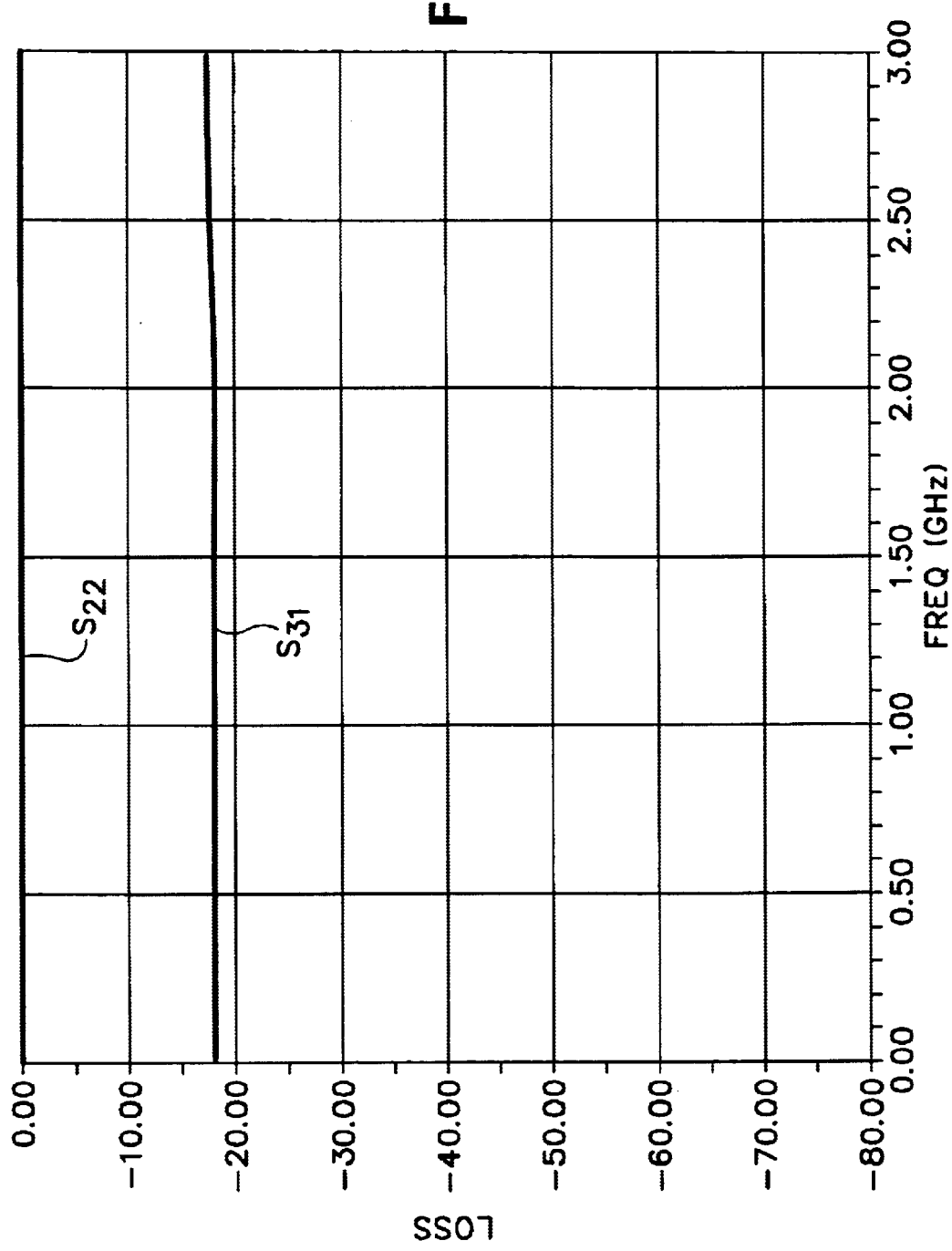
FIG. 10 is a graphic diagram view illustrating the lack of effect on return loss looking back into the test port of the embodiment of FIG. 8.
Figure 11:
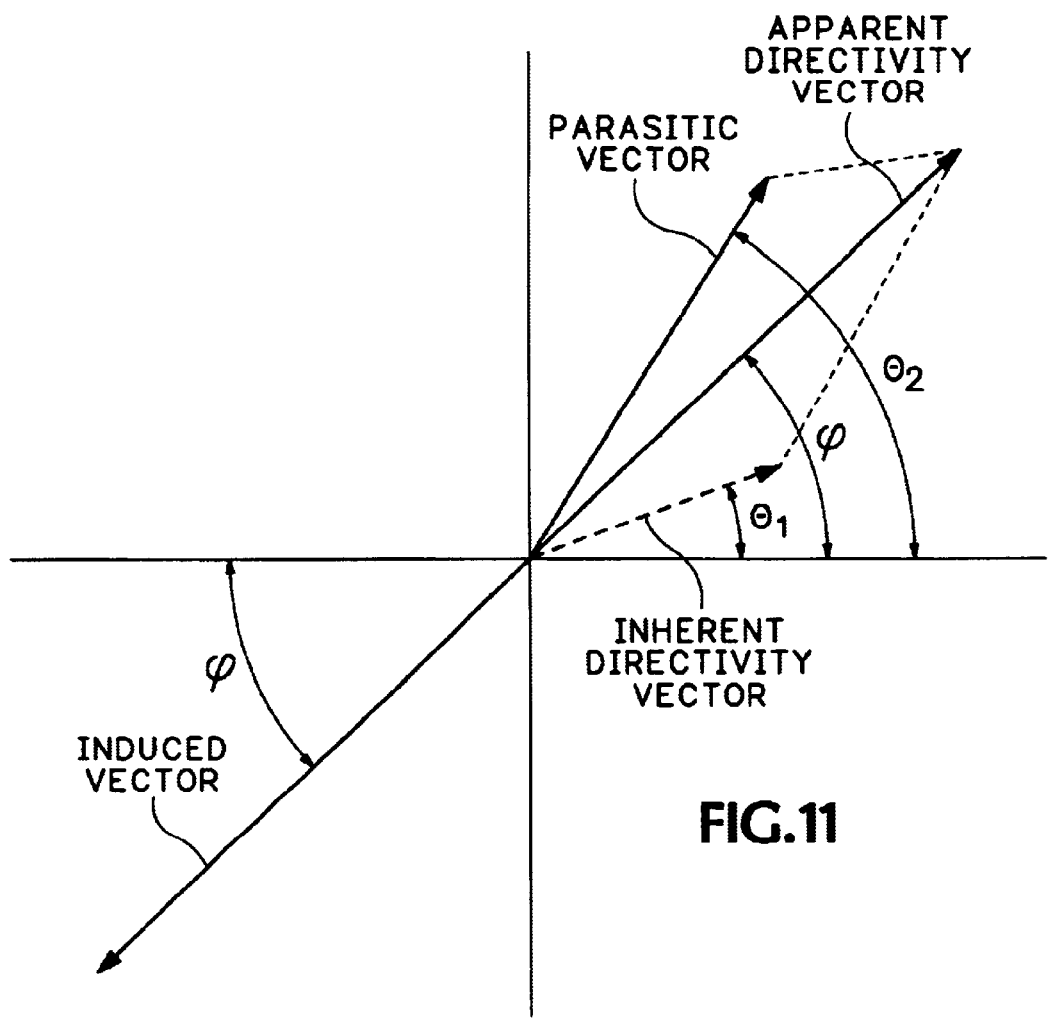
FIG. 11 is a vector diagram view illustrating the parasitic effects on inherent directivity and the correction provided according to the present invention.

There is a drawback to this implementation, as shown in FIG. 7 where a ripple is noted in $S_{31}$ when a perfect short is applied to port P2, which is another figure of merit for a return loss bridge. As shown this implementation also degrades the flatness of port P3 for the reverse traveling wave and degrades the return loss $S_{22}$ of the test port P2 (compare FIG. 2 with FIG. 6). Therefore an alternative embodiment is shown in FIG. 8. In this case there are no significant parasitic effects causing reflections, only the inherent directivity, so it is undesired to induce the opposing counteractive reflected energy vector in the transmission path between port P2 and the coupling resistor $R_0/k$ to improve directivity and thus degrade test port return loss $S_{22}$ and flatness at port P3. Instead energy from the transmission path between the coupling resistor $R_0/k$ and port P2 is coupled to port P3 with directional couplers 20. A transmission line 22 connects the two couplers 20, with the length of the transmission line determining the phase of the coupled energy and a coupling coefficient determining the magnitude. The couplers 20 are terminated by respective load resistors $R_c$. The coupled energy from port P2 recouples to port P3 equal in magnitude, but out of phase, with the energy from the inherent directivity vector. FIG. 9 shows a null in the apparent directivity created at 2 GHz. The apparent directivity is increased beyond the inherent directivity without degrading port P2 return loss $S_{22}$. FIG. 10 shows port P3 response with a perfect short at the test port—no ripple in the response.

Figure 12:
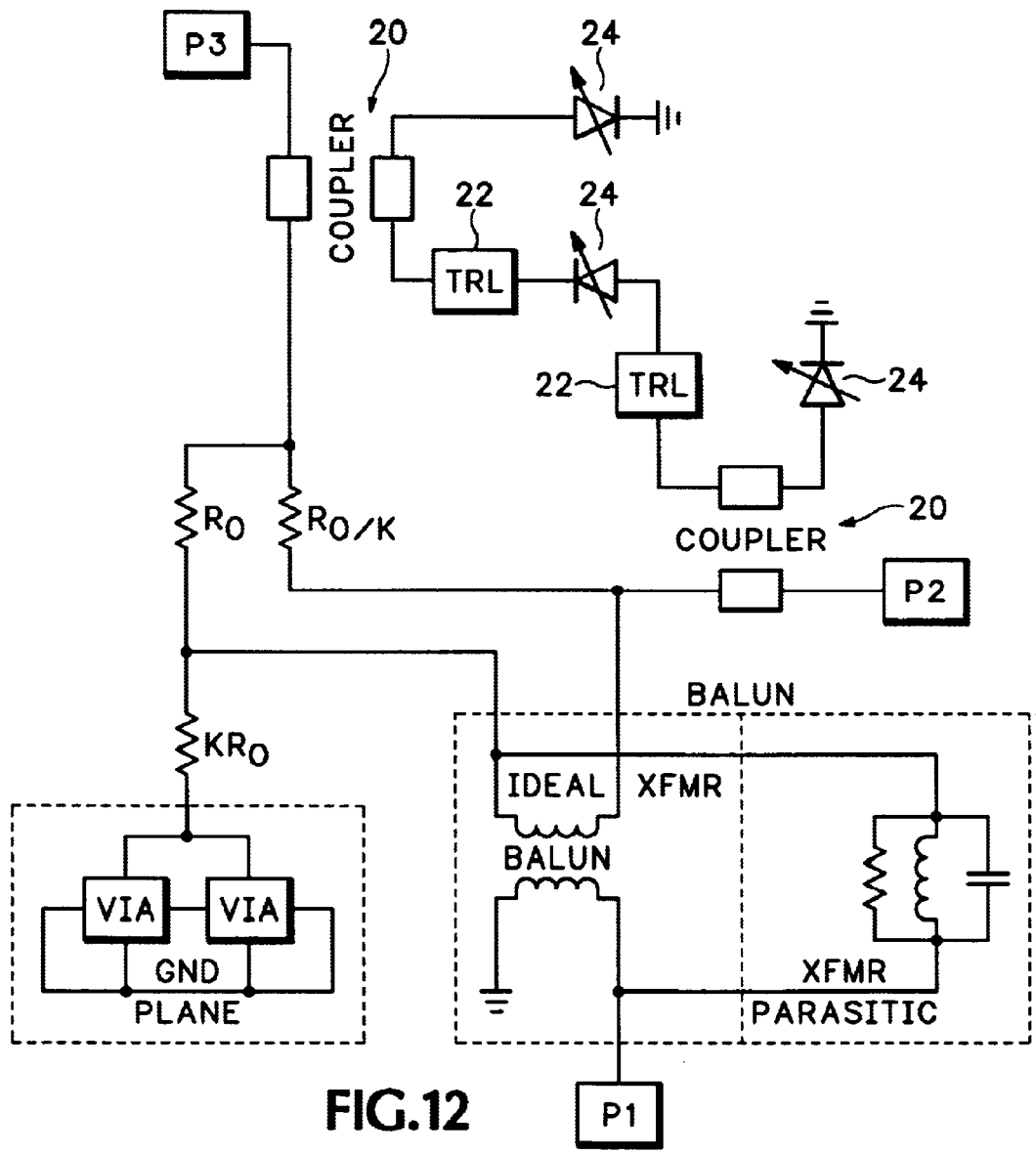
FIG. 12 is a schematic diagram view of another embodiment of a return loss bridge having improved directivity according to the present invention.

The coupling embodiment is a simplified version. FIG. 12 shows a tunable version. PIN diodes 24 may be used to adjust the amplitude and phase of the coupled energy to null the energy at port P3. In this case the couplers 20 provide more energy than is required to cancel the magnitude of the inherent directivity vector, i.e., the coupling coefficient is greater. This allows the null to be electronically tunable within and somewhat beyond the bandwidth of the couplers 20, as shown in FIG. 13. Using PIN diodes 24, apparent directivity on the order of 60–70 dB may be achieved over a narrow frequency band without degrading the return loss $S_{22}$ of port P2. If the return loss of port P2 is good to begin with—without the discontinuities described above—very accurate return loss magnitude measurements of well matched loads over a narrow band may be made because the error in the measurement due to the directivity of the bridge becomes negligible and the accuracy is only limited by port P2 return loss and the accuracy of the measurement instrument receiver, such as a spectrum analyzer, power meter, etc., at port P3.

Thus the present invention provides frequency selective improved apparent or inherent directivity for a return loss bridge having imperfections by inducing or coupling energy of equal magnitude and opposite phase in the path between a test port and a coupled port to counteract the reflected energy caused by such imperfections.

What is claimed is:

1. A return loss bridge having improved directivity in the presence of imperfections, the return loss bridge having a transmission port with a balun coupled to a test port to form a transmission path and a coupled port coupled to the test port through a coupling resistor, comprising:
   means coupled in the transmission path between the test port and the coupled port for counteracting reflected energy at the coupled port due to the imperfections to produce the improved directivity.

2. The return loss bridge as recited in claim 1 wherein the counteracting means comprises:
   means in the transmission path between the coupling resistor and the test port for inducing a counteractive reflected energy vector having a magnitude equal to the magnitude of an apparent directivity vector for the return loss bridge; and
   means in the transmission path between the coupling resistor and the test port for adjusting the phase of the counteractive reflected energy vector to be opposite to the phase of the apparent directivity vector.

3. The return loss bridge as recited in claim 2 wherein the inducing means comprises an open circuit stub coupled between the coupling resistor and the test port to generate the counteractive reflected energy vector having a magnitude equal to the magnitude of the apparent directivity vector.

4. The return loss bridge as recited in claim 3 wherein the adjusting means comprises a transmission line coupled between the coupling resistor and the open circuit stub to adjust the phase of the counteractive reflected energy vector to be opposite to the phase of the apparent directivity vector.

5. The return loss bridge as recited in claim 1 wherein the counteracting means comprises means for coupling a counteractive reflected energy vector from the test port to the coupling port of a magnitude equal to the magnitude of and a phase opposite to the phase of an apparent directivity vector for the return loss bridge.

6. The return loss bridge as recited in claim 5 wherein the coupling means comprises:
   a pair of directional couplers, one coupled in the transmission path between the test port and the coupling resistor and the other coupled to the coupled port, having a coupling coefficient such that the magnitude of the counteractive reflected energy vector at the coupled port is equal to the magnitude of the apparent directivity vector; and
   a transmission line coupled between the directional couplers having a length such that the phase of the counteractive reflected energy vector at the coupled port is opposite to the phase of the apparent directivity vector.

7. The return loss bridge as recited in claim 1 wherein the counteracting means comprises means for coupling a counteractive reflected energy vector from the test port to the coupled port, the coupling means including means for adjusting the magnitude and phase of the counteractive reflected energy vector to be equal in magnitude but opposite in phase to an apparent directivity vector for the return loss bridge.

8. The return loss bridge as recited in claim 7 wherein the adjusting means comprises:
   a PIN diode used as a variable resistance to control the magnitude of the counteractive reflected energy vector at the coupled port to be equal to the magnitude of the apparent directivity vector; and
   a PIN diode phase adjustor in a load path for the coupling means to control the phase of the counteractive reflected energy vector at the coupled port to be opposite to the phase of the apparent directivity vector.

9. The return loss bridge as recited in claim 7 wherein the adjusting means comprises a PIN diode adjustor at either end of the coupling means to control the magnitude and phase of the counteractive reflected energy vector to be equal in magnitude but opposite in phase to the apparent directivity vector.

* * * * *